United States Patent
Coenraads et al.

(10) Patent No.: US 6,191,640 B1
(45) Date of Patent: *Feb. 20, 2001

(54) METHOD AND DEVICE FOR DRIVING A TURN-OFF THYRISTOR

(75) Inventors: Ard Coenraads, Utrecht (NL); Horst Grüning, Wettingen (CH)

(73) Assignee: Asea Brown Boveri AG, Baden (CH)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/118,903

(22) Filed: Jul. 20, 1998

(30) Foreign Application Priority Data

Jul. 24, 1997 (DE) ................................. 197 31 836

(51) Int. Cl.⁷ .......................... H03K 17/732; H03K 17/72
(52) U.S. Cl. ................................ 327/443; 327/442
(58) Field of Search .................... 327/440, 442, 327/443, 438, 453, 475, 445, 439; 361/56, 100, 91.8, 91.7

(56) References Cited

U.S. PATENT DOCUMENTS

| | | | |
|---|---|---|---|
| 4,097,770 | * | 6/1978 | Fisher ................................ 327/475 |
| 4,203,047 | * | 5/1980 | Seki .................................. 327/443 |
| 4,298,809 | * | 11/1981 | Onda et al. ......................... 327/442 |
| 4,593,204 | * | 6/1986 | McMurray ......................... 327/443 |
| 5,493,247 | * | 2/1996 | Gruning ............................. 327/440 |
| 5,684,426 | * | 11/1997 | De Doncker ....................... 327/440 |

FOREIGN PATENT DOCUMENTS

| | | |
|---|---|---|
| 3418657 A1 | 11/1985 | (DE) . |
| 34 34 607 | 3/1986 | (DE) . |
| 3446344 A1 | 6/1986 | (DE) . |
| 3509617 A1 | 9/1986 | (DE) . |
| 37 14 683 | 10/1987 | (DE) . |
| 197 08 873 | 3/1997 | (DE) . |
| 0 144 978 | 6/1985 | (EP) . |
| 0 416 933 | 3/1991 | (EP) . |
| 0 489 945 A1 | 6/1992 | (EP) . |
| 0 712 206 A2 | 5/1996 | (EP) . |
| WO 93/09600 | 5/1993 | (WO) . |
| WO 94/07309 | 3/1994 | (WO) . |

OTHER PUBLICATIONS

M. Bildgen, et al., Elektronik, vol. 26, pp. 59–62, "Verbesserter Wirkungsgrad Bei LeistungsschalTern", Dec. 22, 1989.

"An Optimum Gate Drive For High Power GTO Thyristors" by H.A. Kojori, M. Narui, F.P. Dawson, Dept. Of Electrical Engineering, University of Toronto, Publication Date Feb. 23, 1992 IEEE, pp. 439–444.

* cited by examiner

Primary Examiner—Timothy P. Callahan
Assistant Examiner—Terry L. Englund
(74) Attorney, Agent, or Firm—Oblon, Spivak, McClelland, Maier & Neustadt, P.C.

(57) ABSTRACT

A method for turning a GTO on and off and a corresponding driving circuit are specified. A turn-on current and a holding current are generated from voltage pulses which are converted into currents with the aid of an electric energy store. In terms of circuitry, it is particularly advantageous when the required voltage pulses are drawn from the same energy source, or the same energy store, as the pulse required to generate the turn-off current. The holding current is preferably generated by repeating voltage pulses. The repetition frequency of said voltage pulses can then be increased or reduced as required. The frequency is reduced, in particular, when the gate-cathode voltage becomes negative, and is increased again when the voltage is positive again.

10 Claims, 5 Drawing Sheets

METHOD AND DEVICE FOR DRIVING A TURN-OFF THYRISTOR

BACKGROUND OF THE INVENTION

1. Field of the Invention

The invention relates to the field of power electronics. It proceeds from a method and a device for turning a GTO on and off in accordance with the preambles of the independent claims.

2. Discussion of Background

A method and a device of the generic type are disclosed in European Patent Application EP 0 489 945 A1. A description is given of the so-called hard driving of a turn-off thyristor, in which, by contrast with conventional driving, a higher and very much steeper current is applied to the gate to turn off GTO. Moreover, means are provided for generating a turn-on current. Said means generate a current for turning the GTO on, and a holding current for maintaining the turned-on state. The means comprise in each case capacitors in which the required energy is stored and drawn as required with the aid of switches.

A spatial arrangement for a driving unit of the generic type has, furthermore, been disclosed in the German Patent Application with the file number 197 08 873.2, which was not published before the priority date of the present application. This is because arrangements designed to have very low inductance are required to implement hard driving. For this purpose, it is proposed, in the patent application not published before the priority date of the present application, to arrange the components in the immediate vicinity of the GTO.

In very general terms, however, it would be desirable to have a driving circuit which manages with as little outlay as possible in terms of circuitry and energy in order to permit the design of a compact power converter.

SUMMARY OF THE INVENTION

Accordingly, one object of the invention is to provide a novel driving method and a corresponding circuit arrangement which manage with an extremely small amount of space and energy and are suitable, in particular, for the application of the hard driving method. This object is achieved by means of the features of the independent claims.

Thus, the core of the invention is that the turn-on current and the holding current are generated from voltage pulses which are converted into currents with the aid of an electric energy store. In terms of circuitry, it is particularly advantageous when the required voltage pulses are drawn from the same energy source, or the same energy store, as the pulse required to generate the turn-off current. The holding current is preferably generated by repeating voltage pulses. The repetition frequency of said voltage pulses can be increased or reduced as required. In particular, when the gate-cathode voltage becomes negative, the frequency is reduced, and then is raised again in the case of a newly positive voltage.

In a driving circuit according to the invention, the turn-on circuit comprises at least one electric energy store which converts the voltage pulses into currents. It is possible to provide a common energy store for the turn-on current and for the holding current, or else to provide separate energy stores. The transmission of the required energy from the energy store of the turn-off circuit to the energy stores of the turn-on circuit can be performed either by means of inductive coupling or by means of capacitive coupling. Particular preference is given to a driving circuit in which the electric feeding of the required logic circuits and the other components is based on the abovementioned energy store of the turn-off circuit.

The outlay in terms of circuitry can be kept extremely low by means of the method according to the invention and the corresponding device. The efficiency of the circuit arrangement is very high. It is therefore possible to arrange the driving circuit very near the GTO and to keep the inductance low, as desired.

Further advantageous embodiments follow from the corresponding dependant claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
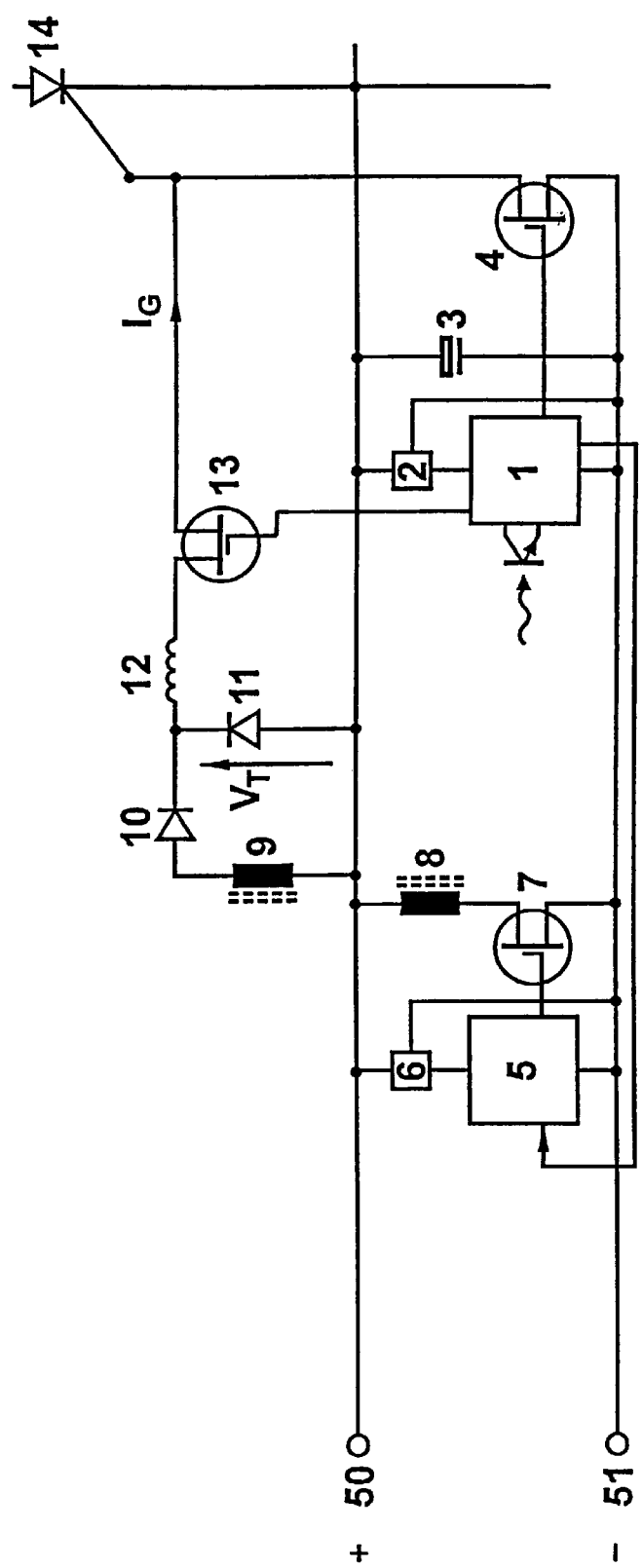
FIG. 1 shows a circuit diagram of a first embodiment of the invention.

The designations used in the drawings and their significance are listed by way of summary in the list of designations.

DESCRIPTION OF THE PREFERRED EMBODIMENTS

Referring now to the drawings, wherein like reference numerals designate identical or corresponding parts throughout the several views, a circuit diagram of a driving circuit for a turn-off thyristor 14 is shown in FIG. 1. 50 and 51 denote the positive and negative terminals of a voltage source having, for example, a 20 V output voltage. An energy store 3 belonging to a turn-off circuit is fed from said voltage source. The energy store 3 can be designed, in particular, in the form of an electrolytic capacitor bank. In addition to the turn-off circuit, the driving circuit also comprises a turn-on circuit. The turn-off circuit is essentially formed by a turn-off logic circuit 1, by the energy store 3 and a switch 4. The switch 4 is connected to the gate of the GTO 14 and to the energy store 3, and is driven by the turn-off logic circuit 1. The turn-off logic circuit 1 is preferably fed from a series controller 2 (a commercially available voltage controller). The turn-off logic circuit 1 receives the required control signals via, for example, an optical fiber, indicated by the arrow, and the transistor on the left-hand edge of the block of the turn-off logic circuit 1. An instruction, sent via the optical fiber, to turn off the GTO 14 is amplified in the logic circuit 1 and forms a voltage at the switch 4, with the result that the latter starts to conduct. Because of the polarity of the energy store 3, a current is therefore drawn from the gate of the GTO 14. As a result, the gate of the GTO becomes negative with respect to the cathode, and the GTO turns off. The switch 4 may also comprise, in particular, a parallel circuit of MOSFETs. Analagously, the energy store 3 may comprise a plurality of parallel-connected electrolytic capacitors.

A turn-on circuit is also provided. Said circuit comprises a turn-on logic circuit 5, which is fed from the energy store 3 in the same way as the turn-off logic circuit 1. The corresponding series controller is denoted by 6. The two logic circuits 1 and 5 are connected to one another in signaling terms. If the turn-off logic circuit 1 receives an instruction to turn off the GTO 14, activation of the turn-on logic circuit 5 is prevented in this way. However, if the logic circuit 1 receives a turn-on instruction, the turn-on logic circuit 5 causes the switch 7, which it drives, to operate in the switching mode. The switch 7 is likewise arranged between the terminals 50 and 51. The voltage pulses generated in this way are transmitted with the aid of the transformers 8, 9, which are connected in series with the switch 7, to a rectifier diode 10 which feeds an electric energy store, preferably an inductor 12. In order, as desired, to keep the entire arrangement low in inductance, the inductors of the transformers 8, 9 should be smaller than the inductor 12. This can be achieved in structural terms, for example, by integrating the coils 8 and 9 on the printed circuit board and coupling them magnetically with a core. Depending on the required size of the inductor 12, it too can be integrated on the printed circuit board as a conductor loop. The inductor 12 is connected to the gate of the GTO 14 via a further switch 13. The switch 13 isolates the turn-on circuit from the gate of the GTO during turning off and in the turned-off state. The switch 13 is controlled by the turn-off logic circuit 1 and is turned off during turning off the GTO 14 and in the turned-off state of the GTO 14.

Figure 5:
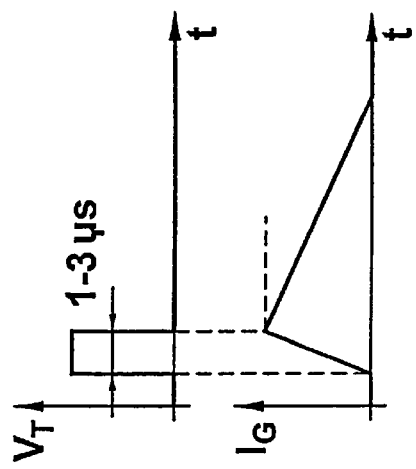
FIG. 5 shows a diagrammatic representation of the voltage pulse and the current generated thereby.

FIG. 5 shows such a voltage pulse $V_T$, which is transmitted via the transformers 8, 9. On the secondary side, the voltage pulse is rectified by the diode 10 and converted into a current in the inductor 12. The current can ring around via the free-wheeling diode 11 arranged between the positive terminal 50 and the cathode of the retifier diode 10. The current through the inductor 12 has a triangular shape to a first approximation, as represented in FIG. 5. For a 3 kA, 4.5 kV GTO, approximately 200 A to 400 A are required for turning on, and should be maintained for approximately 5 to 15 $\mu$s. This gives exemplary values in the range of 100 nH for the inductor 12. After turning on, the GTO 14 still requires a certain holding current, however, in order to maintain the turned-on state. The easiest way of doing this is to repeat the turn-on pulse described at a specific frequency f1.

Figure 2:
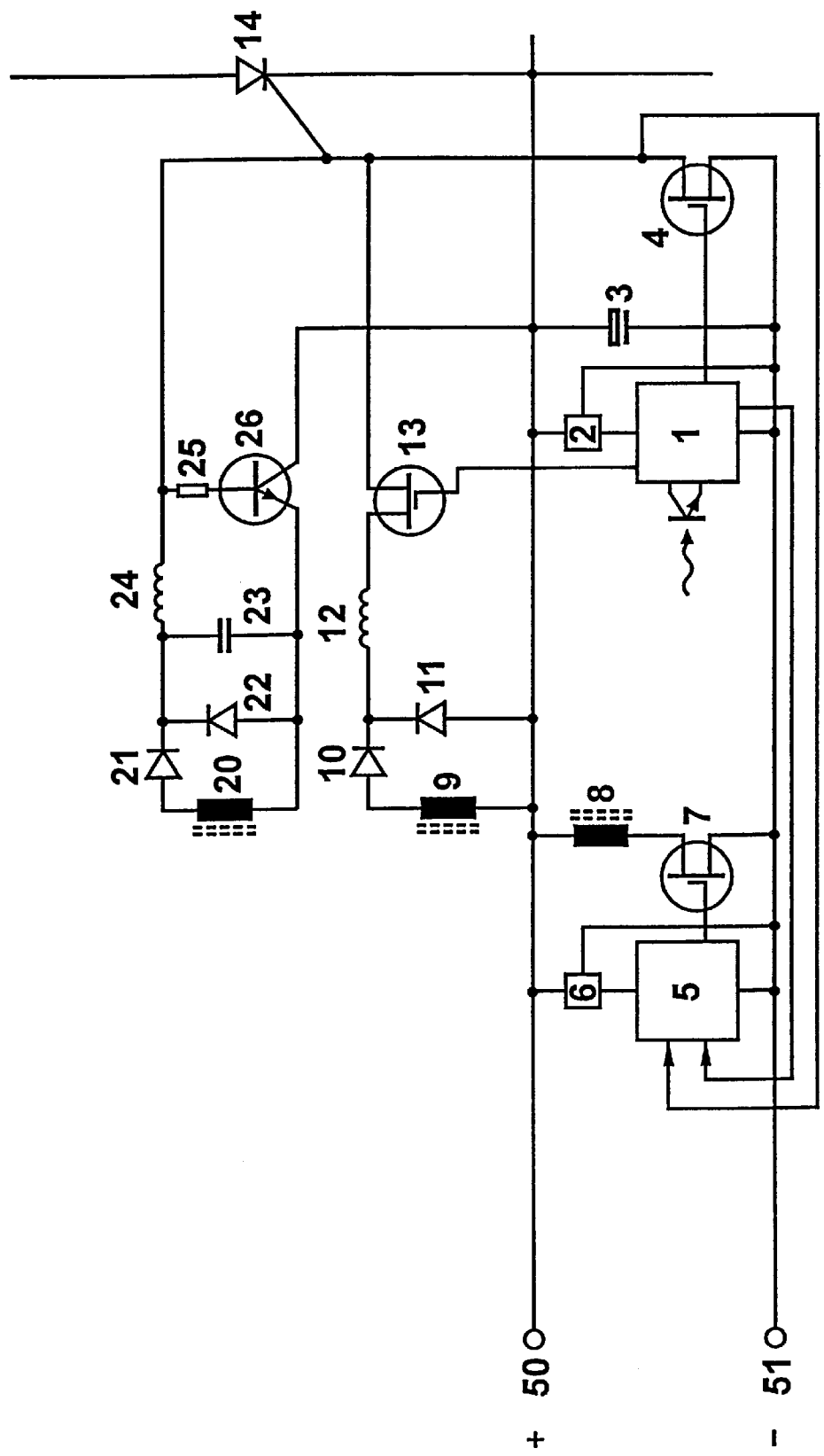
FIG. 2 shows a circuit diagram of a second embodiment of the invention.

There is a very different current requirement for triggering, on the one hand, and for maintaining the triggered state, on the other hand. As mentioned, approximately 200 A are required for triggering for GTOs of the highest power, whereas the holding current only has to be approximately 2 A. It would be advantageous for this reason if the holding current could be generated with less power than by repeating the turn-on pulse. FIG. 2 shows an exemplary embodiment which meets this requirement. A second inductor 24 is provided, which is likewise fed by way of the transformer via a second secondary winding 20. The rectifier diode is given the reference numeral 21, and the free-wheeling diode the numeral 22. A capacitor 23 is preferably connected in parallel with the free-wheeling diode 22. The capacitor 23 permits energy to be drawn more slowly, with the result that the repetition frequency can be kept lower and the holding current is nevertheless sufficiently uniform. As a result, the inductor 24 can be selected to be larger than the inductor 12, for example in the range from 10 to 15 $\mu$H. Instead of a second secondary winding 20, it is also possible to provide a dedicated transformer and a dedicated logic circuit. In the case of this generation, isolated from the generation of the turn-on pulse, of the holding current the switch 13 is opened after triggering of the GTO 14, with the result that the inductor 12 is isolated from the gate.

In the case of the isolated generation of the holding current, active current-rise limiting means 25, 26 are connected between the gate and the cathode of the GTO 14. To limit the holding current, the means comprise a transistor 26 which, in the case of FIG. 2, is connected into the current path between the turn-on circuit and the cathode of the GTO 14. A circuit having a bipolar transistor 26 and a base series resistor 25 is preferred. Said means reliably prevents the holding current from being able to rise without impediment in the case of a negative gate-cathode voltage. This is because, in the case of a negative voltage, the diode 22 is turned on, and the current could therefore rise without impediment. This is effectively prevented by the device according to the invention.

Figure 3:
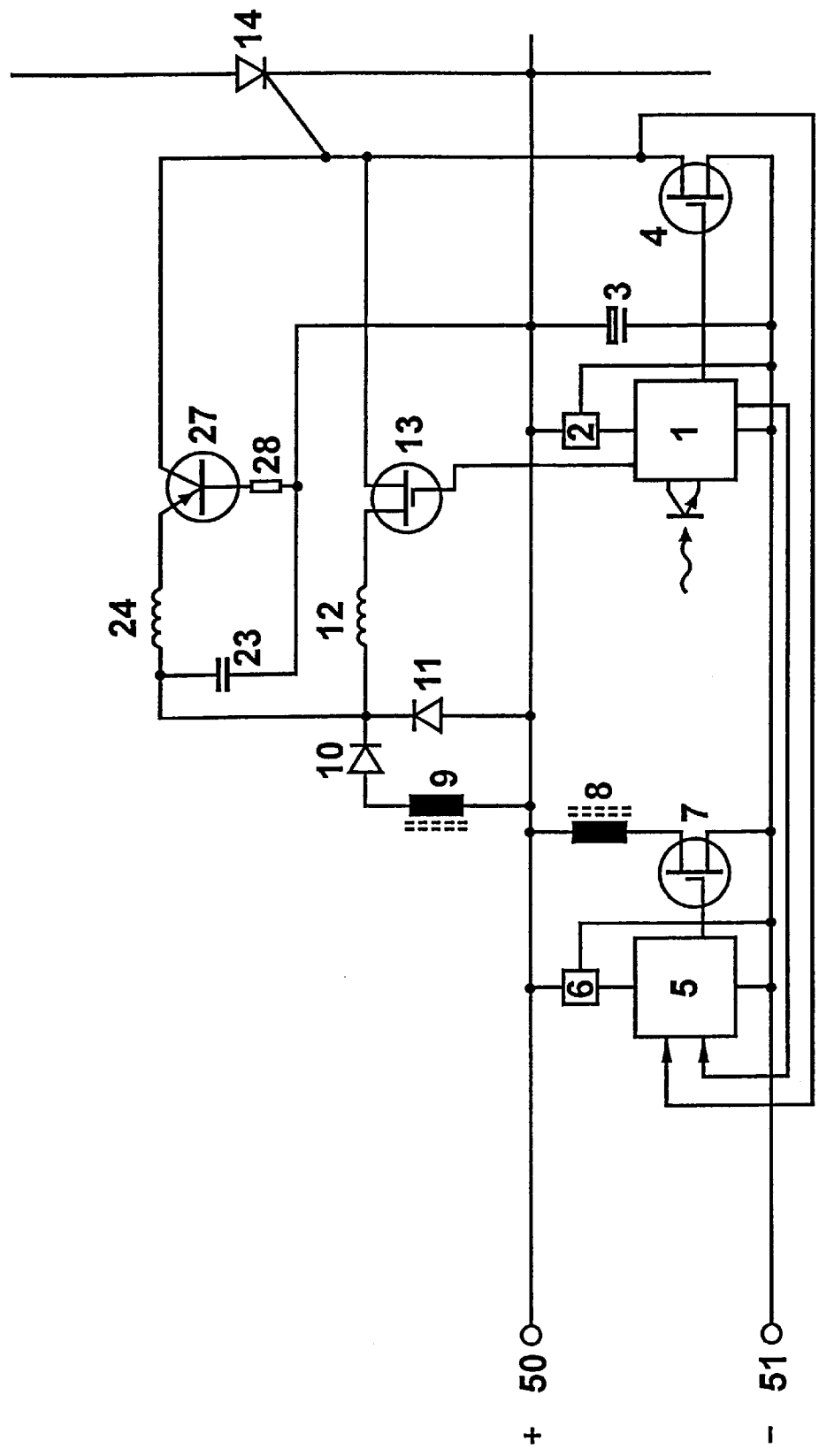
FIG. 3 shows a circuit diagram of a third embodiment of the invention.

The voltage pulse required for generating the holding current can also be tapped, without a second secondary winding, directly at the rectified voltage downstream of the diode 10. FIG. 3 shows a corresponding exemplary embodiment. The common nodal point of the rectifier diode 10 and the free-wheeling diode 11 is connected to the second inductor 24. The current-rise limiting means have the reference numeral 27 for the bipolar transistor and 28 for the series resistor. A transistor of reverse polarity is used in this exemplary embodiment, and the transistor 27 is connected into the gate current path. The method of functioning of this embodiment is essentially the same as that in accordance with FIG. 2. It functions as follows: in the case of a positive gate-cathode voltage, the current from the inductor 24 splits into a base current and a collector current of the transistor 27. The base current switches the transistor on. As a result, the inductor 24 is connected directly to the gate of the GTO 14. In the case of a negative gate-cathode voltage, the transistor starts to control: so that the transistor can carry a collector current, its emitter must be more positive than the base by the forward voltage, that is to say approximately 0.7 V. The inductor 24, which is to be regarded to a first approximation as a current source, continues to operate as a reverse voltage, however. The collector voltage becomes negative as soon as this is required by the commutation operation, that is to say the GTO 14. Nevertheless, a large fraction of the current continues to flow from the inductor 24 via the emitter-collector path. Said current is effectively limited, because the transistor prevents this by virtue of the control condition $U_{on}=U_{EB}+U_R$, where $U_{on}$ denotes the voltage across the inductor, $U_{EB}$ denotes the emitter-base voltage, and $U_R$ denotes the voltage drop across the base series resistor. The device according to FIG. 2 with the npn transistor 26 instead of the pnp transistor 27 explained functions in an analogous way.

Figure 4:
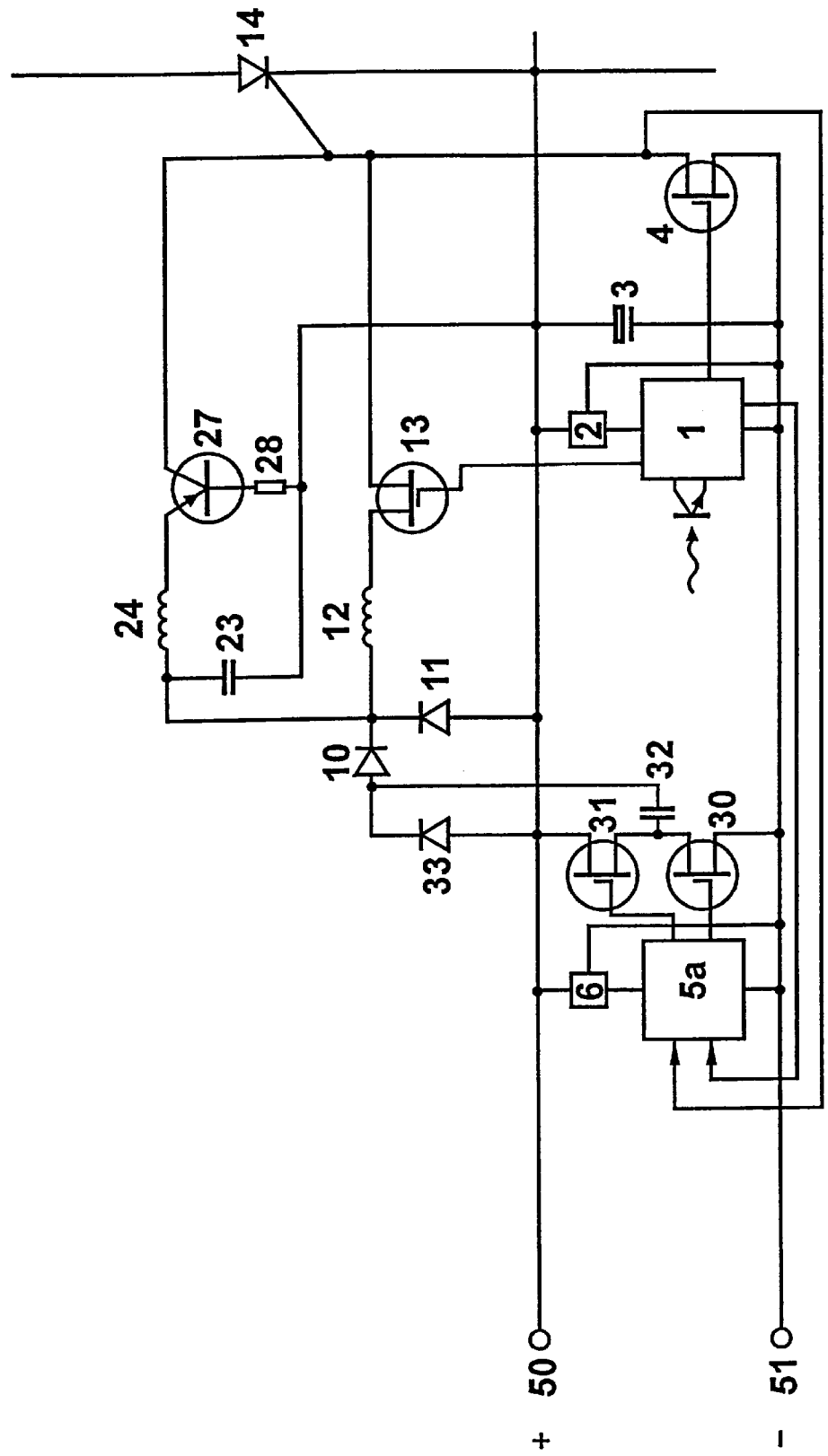
FIG. 4 shows a circuit diagram of a fourth embodiment of the invention.

Instead of an inductive coupling with the aid of a transistor, a capacitive coupling by means of capacitors is also possible. FIG. 4 shows a corresponding exemplary embodiment. A turn-on logic circuit 5a drives two transistors 31 and 30 arranged between the terminals 50 and 51. The transistor 31 generates a positive voltage pulse, and the transistor 30 resets. The voltage pulse generated is passed on to the rectifier diode 10 via a coupling capacitor 32. Also provided is a charge reversal diode 33, which is arranged between the cathode of the GTO and the positive terminal 50 of the voltage source and the rectifier diode 10. Otherwise, the circuit according to FIG. 4 functions in the same way as that already described above.

Figure 6:
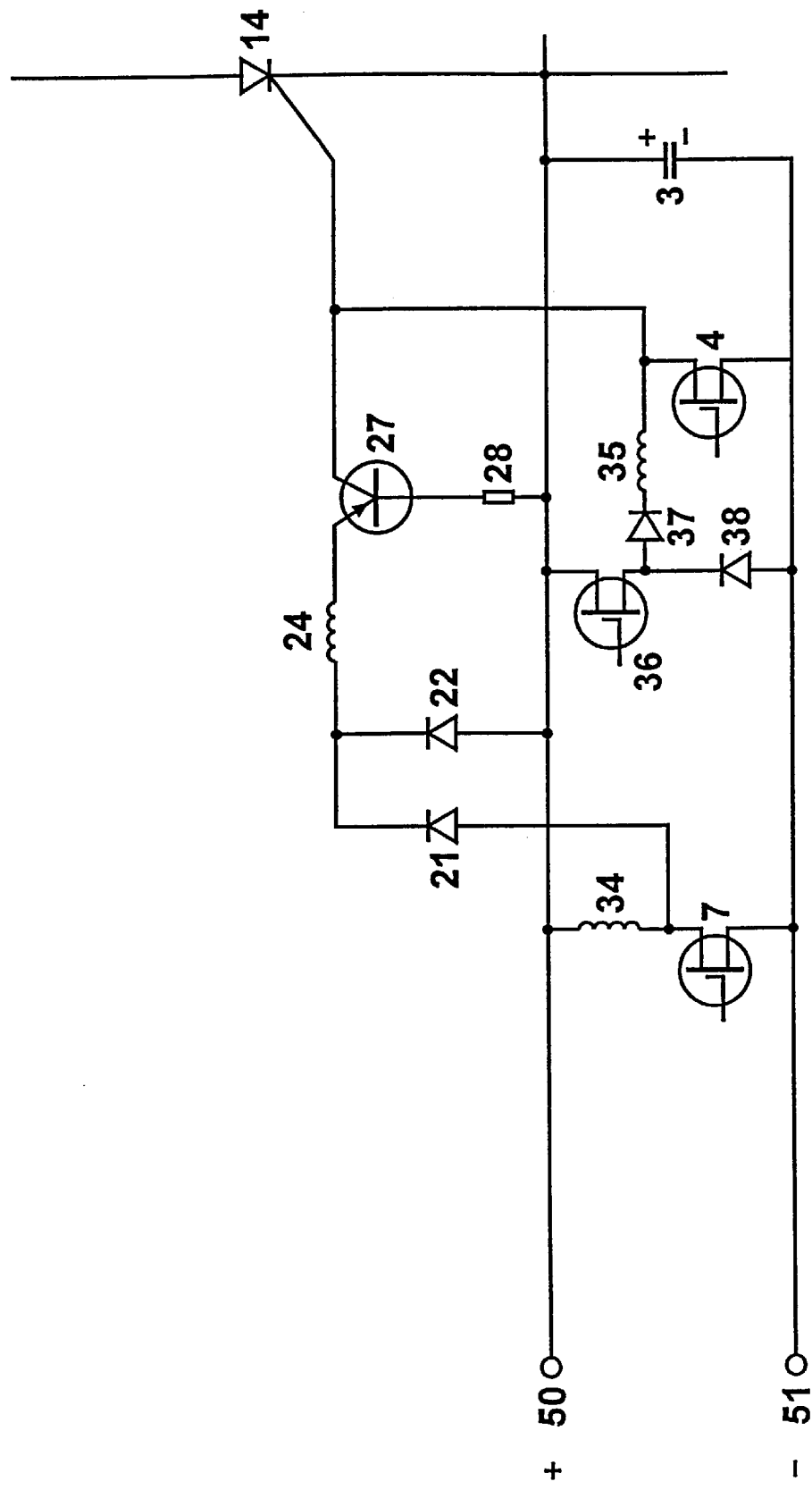
FIG. 6 shows a circuit diagram of a fifth embodiment of the invention.

FIG. 6 shows an embodiment of the invention in which the turn-off circuit is used to aid generation of the gate trigger current. For the sake of clarity, the logic circuits 1 and 5 are not represented here. The circuit functions as follows: a charging transistor 36 connects a connectable trigger inductor 35 to the positive terminal 50 before the turn-off transistor 4 is blocked. As a result, there builds up in the inductor 35 a current which commutes directly to the gate after blocking of the switch 4, and thus forms the required trigger pulse. The inductor 35 can be selected such that the current decays in approximately 5 to 10 $\mu$s. Thereafter, the charging diode 37 connected upstream of the inductor 35 blocks, and the charging transistor 36 can be blocked again. If the switch 36 is opened before the current decays, the residual energy can be returned via the freewheeling diode 38 into the energy store 3. A particularly short, and yet fully effective, trigger pulse is generated in this way. The section of the turn-on circuit which is designed for generating the holding current can be constructed as already described, or the required energy can be transferred to the energy store 24 from the energy store 3 by means of a storage inductor 34 and the rectifier diode 21 by operating the switch 7 in the switching mode. To turn off the GTO 14, a current is drawn from the gate by actuating the switch 4.

The above description specified different variants of the energy coupling and feeding which, although explained only with the aid of individual figures, can, of course, be combined with one another virtually as desired, depending on where the emphasis is to be put in terms of circuitry.

The driving circuit according to the invention and the driving method on which it is based permit a reduction in the repetition frequency f1 or the width of the voltage pulses for the holding current, as soon as a negative gate-cathode voltage occurs across the GTO. As a consequence, the loss occurring in the bipolar transistor of the current-rise limiting means is reduced, particularly in the case of GTOs of the highest power, that is to say those requiring a high holding current (>1 A). The repetition frequency or the pulse width can be further increased after restoration of a positive voltage between the gate and cathode of the GTO. A higher gate current is achieved again as a result, thus ensuring recommutation of the GTO without gaps. A retrigger pulse in the previously conventional form therefore becomes superfluous. This thus eliminates the risk of the retrigger pulse occurring at the wrong instant, and also eliminates all the other problems associated with the accurate detection of the correct instant of the retriggering. Moreover, the EMC immunity of the arrangement can be enhanced in this way. Quite generally, the gate current can be set by influencing the repetition frequency or the pulse width of the voltage pulses.

It was explained earlier that the voltage pulse required to generate the turn-on current or the holding current is drawn from the same energy store 3 as the pulse required for the turn-off current. However, the circuit can also be constructed such that the turn-on circuit has a dedicated voltage supply. The transformers 8, 9 would be omitted in this case, and in return at least one further supply line and one further energy store would be required.

Overall, the method according to the invention and the driving circuit based thereon yield a design which is compact, robust and of low inductance and has great advantages for hard-driven GTOs in particular. It becomes possible to construct the driving unit in the direct vicinity of the GTOs, and thus to produce an exceptionally compact power converter. The efficiency of the arrangement is very high. The driving unit can be constructed as in the German patent application mentioned at the beginning, which was not published before the priority date of the present application. The arrangement specified there is very advantageous particularly for the exchange of defective driving units.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A driving method for turning a turn-off thyristor having at least a gate terminal and a cathode terminal on and off, comprising the following steps:

(a) generating a turn-off current for turning off the turn-off thyristor with the aid of a capacitive first energy store which is arranged between the gate terminal and the cathode terminal of the turn-off thyristor;

(b) generating a turn-on current for turning on the turn-off thyristor;

(c) generating a holding current for maintaining a turned-on state of the turn-off thyristor;

wherein (d) the step of generating the turn-on current includes converting voltage pulses from the capacitive first energy store into a current with the aid of at least one second energy store and the step of generating the holding current includes converting a sequence of said voltage pulses having a variable repetition frequency f1 into a current with the aid of the at least one second energy store.

2. The method as claimed in claim 1, wherein the repetition frequency f1 is reduced as soon as negative gate-cathode voltage is present across the turn-off thyristor and the holding current is generated by repeating the voltage pulse which is used to generate the turn-on current.

3. The method as claimed in claim 1, wherein the repetition frequency f1 of the voltage pulses is increased as soon as a positive gate-cathode voltage is present across the turn-off thyristor after having been negative.

4. A driving circuit for turning a turn-off thyristor having at least a gate terminal and a cathode terminal on and off, the driving circuit comprising:

a turn-off circuit including a capacitive first energy store which is arranged between the gate terminal and the cathode terminal of the turn-off thyristor and configured to generate a turn-off current from energy supplied by the capacitive first energy store and to apply the turn-off current by means of a first switch to the gate terminal of the turn-off thyristor; and a turn-on circuit arranged between the gate terminal and the cathode terminal of the turn-off thyristor and configured to generate a gate trigger current and a holding current which maintains a turned-on state of the turn-off thyristor, wherein the turn-on circuit comprises at least one second energy store configured to convert voltage pulses drawn from the capacitive first energy store, and fed to the at least one second energy store, into the gate trigger current and the holding current.

5. The driving circuit as claimed in claim 4, wherein the turn-on circuit further comprises a second switch and at least one transformer configured to couple the voltage pulses drawn from the capacitive first energy store to the at least one second energy store.

6. The driving circuit as claimed in claim 4, wherein the at least one second energy store of the turn-on circuit comprises a first inductor which is connected to the gate of the turn-off thyristor via another switch.

7. The driving circuit as claimed in claim 6, wherein the at least one second electric energy store of the turn-on circuit further comprises a second inductor and a capacitor with a free-wheeling diode connected in parallel to said capacitor, the second inductor being connected to the gate of the turn-off thyristor, and a switchable current-rise limiter being connected between the gate and the cathode of the turn-off thyristor and in a current path between the turn-on circuit and the cathode of the turn-off thyristor.

8. The driving circuit as claimed in claim 7, wherein the transformer comprises a first secondary winding feeding the first inductor, and a second secondary winding feeding the second inductor.

9. The driving circuit as claimed in claim 4, wherein the turn-on circuit further comprises a second switch and the at least one second energy store comprises a storage inductor configured to provide the voltage pulses from the capacitive first energy store to the at least one second energy store of the turn-on circuit to generate the holding current, the turn-on circuit further comprising a connectable trigger inductor configured to generate the gate trigger current.

10. The driving circuit as claimed in claim 4, wherein the turn-on circuit further comprises a second switch and a coupling capacitor configured to provide the voltage pulses from the capacitive first energy store to the at least one second energy store of the turn-on circuit to provide for the generating of the gate trigger current and the holding current.

* * * * *